United States Patent
Sun et al.

(10) Patent No.: US 12,009,461 B2
(45) Date of Patent: Jun. 11, 2024

(54) MICRO LED DISPLAY DEVICE INCLUDING REFRACTION STRUCTURE

(71) Applicant: PlayNitride Display Co., Ltd., Zhunan Township, Miaoli County (TW)

(72) Inventors: Sheng-Yuan Sun, Zhunan Township (TW); Po-Wei Chiu, Zhunan Township (TW); Loganathan Murugan, Zhunan Township (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 280 days.

(21) Appl. No.: 17/369,322

(22) Filed: Jul. 7, 2021

(65) Prior Publication Data
US 2022/0320386 A1 Oct. 6, 2022

(30) Foreign Application Priority Data
Mar. 30, 2021 (TW) ................... 110111561

(51) Int. Cl.
*H01L 33/58* (2010.01)
*H01L 25/075* (2006.01)
(Continued)

(52) U.S. Cl.
CPC .......... *H01L 33/58* (2013.01); *H01L 25/0753* (2013.01); *H01L 33/60* (2013.01); *G02B 3/08* (2013.01)

(58) Field of Classification Search
CPC ............ G02B 19/0009; G02B 19/0019; G02B 19/0028; G02B 19/0066; H01L 25/0753; H01L 33/60
See application file for complete search history.

(56) References Cited

U.S. PATENT DOCUMENTS

2017/0242549 A1* 8/2017 Lim ...................... G06F 3/0421
2020/0258869 A1   8/2020 Wu et al.
(Continued)

FOREIGN PATENT DOCUMENTS

CN 102386200 A 3/2012
CN 107195853 A 9/2017
(Continued)

OTHER PUBLICATIONS

Taiwanese Office Action and Search Report for Taiwanese Application No. 110111561, dated Oct. 25, 2021.
(Continued)

*Primary Examiner* — Tracie Y Green
(74) *Attorney, Agent, or Firm* — Birch, Stewart, Kolasch & Birch, LLP

(57) ABSTRACT

A micro LED display device is provided. The micro LED display device includes a substrate. The micro LED display device also includes a first micro LED disposed on the substrate. The micro LED display device further includes at least one first refraction structure disposed on and corresponding to the first micro LED. Moreover, the micro LED display device includes a second micro LED disposed on the substrate and adjacent to the first micro LED. The micro LED display device also includes at least one second refraction structure disposed on and corresponding to the second micro LED.

19 Claims, 11 Drawing Sheets

(51) Int. Cl.
  *H01L 33/60* (2010.01)
  *G02B 3/08* (2006.01)

(56) References Cited

U.S. PATENT DOCUMENTS

2020/0355896 A1    11/2020  Woodgate et al.
2021/0074686 A1*    3/2021  Li ........................... H01L 33/38
2022/0216381 A1*    7/2022  Chiang ............... H01L 25/0753

FOREIGN PATENT DOCUMENTS

| | | |
|---|---|---|
| CN | 210778585 U  | 6/2020 |
| CN | 111599850 A  | 8/2020 |
| CN | 111883684 A  | 11/2020 |
| TW | 201227942 A1 | 7/2012 |
| TW | 202018931 A  | 5/2020 |
| TW | 202109867 A  | 3/2021 |

OTHER PUBLICATIONS

Chinese Office Action and Search Report for Chinese Application No. 202110339783.6, dated Nov. 22, 2022.
Chinese Office Action and Search Report for Chinese Application No. 202110339783.6, dated May 31, 2022.

* cited by examiner

MICRO LED DISPLAY DEVICE INCLUDING REFRACTION STRUCTURE

CROSS REFERENCE TO RELATED APPLICATIONS

This Application claims priority of Taiwan Patent Application No. 110111561, filed on Mar. 30, 2021, the entirety of which is incorporated by reference herein.

BACKGROUND

Technical Field

Embodiments of the present disclosure relate in general to a micro LED display device, and in particular they relate to a micro LED display device that includes refraction structures.

Description of the Related Art

A light-emitting diode (LED) display device is an active semiconductor element display device that has the advantages of low power consumption, excellent contrast, and better visibility in sunlight. With the development of portable electronic apparatuses and the increasing requirements that users have for display quality (such as superior color and contrast), micro LED display devices made of light-emitting diodes arranged in arrays have gradually attracted attention in the market.

In the micro LED display devices that are currently available on the market, the light-emitting angle of the display chip (i.e., micro LED) is relatively wide, which may cause insufficient display intensity (e.g., brightness) when the user views the micro LED display device from the front. In addition, since the light-emitting angles of micro LEDs of different colors are different from each other, light mixing may occur when viewed from a specific angle, resulting in poor display quality. Furthermore, the brightness (i.e., the light-emitting efficiency) of the micro LEDs of different colors are different, and specific colors of light (e.g., green) can easily overflow and affect overall display quality.

Although existing micro LED display devices generally meet demand, there are still some problems. How to improve the existing micro LED display devices has become one of the issues that the industry attaches great importance to.

SUMMARY

In the micro LED display device according to the embodiments of the present disclosure, at least one refraction structure is disposed on and corresponds to each micro LED. The refraction structure may change the light-emitting direction of the micro LED, thereby increasing the overall brightness of the micro LED display device in the forward direction (i.e., the normal direction of the light-emitting surface of the micro LED). Moreover, the refraction structure may effectively reduce light mixing, thereby improving the display quality of the micro LED display device.

Some embodiments of the present disclosure include a micro LED display device. The micro LED display device includes a substrate. The micro LED display device also includes a first micro LED disposed on the substrate. The micro LED display device further includes at least one first refraction structure disposed on and corresponding to the first micro LED. Moreover, the micro LED display device includes a second micro LED disposed on the substrate and adjacent to the first micro LED. The micro LED display device also includes at least one second refraction structure disposed on and corresponding to the second micro LED.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
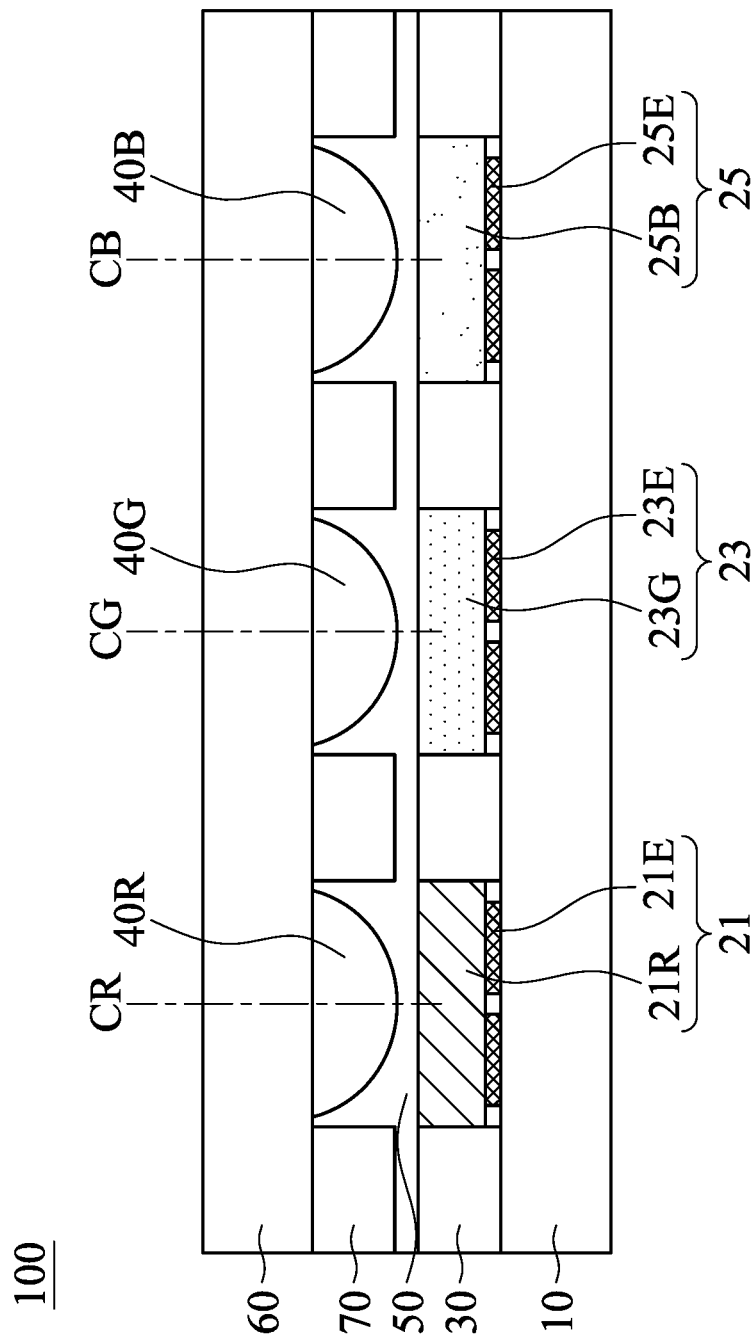
FIG. 1 is a partial cross-sectional view illustrating the micro LED display device according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples.

This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +1-0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a partial cross-sectional view illustrating the micro LED display device 100 according to one embodiment of the present disclosure. It should be noted that some components of the micro LED display device 100 have been omitted in FIG. 1 for the sake of brevity.

Referring to FIG. 1, in some embodiments, the micro LED display device 100 includes a substrate 10. The substrate 10 may be, for example, a display substrate, a light-emitting substrate, a substrate with functional elements such as thin-film transistors (TFT) or integrated circuits (IC), or other types of circuit substrates, but the present disclosure is not limited thereto. For example, the substrate 10 may be a bulk semiconductor substrate or include a composite substrate formed of different materials, and the substrate 10 may be doped (e.g., using p-type or n-type dopants) or undoped. In addition, the substrate 10 may include a semiconductor substrate, a glass substrate, or a ceramic substrate, such as a silicon substrate, a silicon germanium substrate, a silicon carbide substrate, an aluminum nitride substrate, a sapphire substrate, the like, or a combination thereof, but the present disclosure is not limited thereto.

Referring to FIG. 1, in some embodiments, the micro LED display device 100 includes a micro LED 21, a micro LED 23 and a micro LED 25 disposed on the substrate 10. In particular, the micro LED 23 is adjacent to the micro LED 21 and the micro LED 25, respectively. For example, the micro LED 21 and the micro LED 25 are respectively arranged on opposite sides of the micro LED 23, but the present disclosure is not limited thereto. Here, the length or width of the micro LED 21, the micro LED 23, and the micro LED 25 may be within a range of about 2 μm to about 5 μm, and the thickness of the micro LED 21, the micro LED 23, and the micro LED 25 may be within a range of about 8 μm to about 10 μm, but the present disclosure is not limited thereto.

The micro LED 21 may be a red micro LED that includes a red chip 21R and electrodes 21E connected with the red chip 21R; the micro LED 23 may be a green micro LED that includes a green chip 23G and electrodes 23E connected with the green chip 23G; the micro LED 25 may be a blue micro LED that includes a blue chip 25B and electrodes 25E connected with the blue chip 25B, but the present disclosure is not limited thereto. For example, the micro LED 21, the micro LED 23, and the micro LED 25 may also emit other colors of light, such as white light, yellow light, cyan light, magenta light, emerald light, and so on.

The micro LED 21, the micro LED 23, and the micro LED 25 may be formed on the substrate 10 by an epitaxial growth process. For example, the epitaxial growth process may include metal organic chemical vapor deposition (MOCVD), hydride vapor phase epitaxy (HVPE), molecular beam epitaxy (MBE), any other applicable method, or a combination thereof, but the present disclosure is not limited thereto.

As shown in FIG. 1, in some embodiments, the micro light-emitting diode display device 100 includes a reflective layer 30 disposed on the substrate 10 and surrounding the micro LED 21, the micro LED 23, and the micro LED 25. In particular, the reflective layer 30 disposed may be disposed between the micro LED 21 and the micro LED 23, or between the micro LED 23 and the micro LED 25. For example, For example, the material of the reflective layer 30 may include metal, such as nickel, silver, platinum, and so on, or the material of the reflective layer 30 may include (white) resin, but the present disclosure is not limited thereto. The reflective layer 30 may be formed on the substrate 10 by physical vapor deposition (PVD), chemical vapor deposition (CVD), atomic layer deposition (ALD), evaporation, sputtering, the like, or a combination thereof, but the present disclosure is not limited thereto.

Referring to FIG. 1, in some embodiments, the micro LED display device 100 includes a refraction structure 40R, a refraction structure 40G, and a refraction structure 40B respectively disposed on and corresponding to the micro LED 21, the micro LED 23, and the micro LED 25. That is, in the micro LED display device 100, the LED of each color light may be configured with a corresponding refraction structure.

The material of the refraction structure 40R, the refraction structure 40G, and the refraction structure 40B may include glass, epoxy resin, silicone resin, polyurethane, any other applicable material, or a combination thereof, but the present disclosure is not limited thereto. For example, the refraction structure 40R, the refraction structure 40G, and the refraction structure 40B may be formed by a photoresist reflow method, a hot embossing method, any other applicable method, or a combination thereof. The steps of forming the refraction structure 40R, the refraction structure 40G, and the refraction structure 40B may include a spin coating process, a lithography process, an etching process, any other applicable process, or a combination thereof, but the present disclosure is not limited thereto.

Referring to FIG. 1, in some embodiments, the micro LED display device 100 includes an interlayer 50 disposed between the micro LED 21 and the refraction structure 40R, and the interlayer 50 is also disposed between the micro LED 23 and the refraction structure 40G, or between the micro LED 25 and the refraction structure 40B. The interlayer 50 may be, for example, air or a light-transmitting material (e.g., an organic glue material). Moreover, in some embodiments, the refractive index of the interlayer 50 is different from the refractive index of the refraction structure 40R, the refraction structure 40G, and the refraction structure 40B.

For example, the refractive index of the interlayer 50 may be within a range of about 1.0 to about 1.5, the refractive index of the refraction structure 40R, the refraction structure 40G, and the refraction structure 40B may be within a range of about 1.2 to about 1.5, and the refractive index of the interlayer 50 may be smaller than the refractive index of the refraction structure 40R, the refraction structure 40G, and the refraction structure 40B, but the present disclosure is not limited thereto. As shown in FIG. 1, the refraction structure 40R, the refraction structure 40G, and the refraction structure 40B may include micro lenses. In more detail, the refraction structure 40R, the refraction structure 40G, and the refraction structure 40B may include micro (semi-) convex lenses. For example, the respective radius of the refraction structure 40R, the refraction structure 40G, and the refraction structure 40B may be, for example, within a range of about 0.5 μm to about 3.0 μm. Moreover, the refraction structure 40R, the refraction structure 40G, and the refraction structure 40B shown in FIG. 1 have the same size, but the present disclosure is not limited thereto. The refraction structure 40R, the refraction structure 40G, and the refraction structure 40B may also have different sizes (e.g., different radii or thicknesses).

As shown in FIG. 1, in some embodiments, the optical axis CR of the refraction structure 40R passes through the center of the light-emitting surface of the micro LED 21, the optical axis CG of the refraction structure 40G passes through the center of the light-emitting surface of the micro LED 23, and the optical axis CB of the refraction structure 40B passes through the center of the light-emitting surface of the micro LED 25.

The refraction structure 40R may be used to adjust the light pattern of the light emitted by the micro LED 21, so that the light emitted by the micro LED 21 is converged to the center compared with when the refraction structure 40R is not provided. Similarly, the refraction structure 40G and the refraction structure 40B may be used to adjust the light patterns of the lights emitted by the micro LED 23 and the micro LED 25, so that the lights emitted by the micro LED 23 and micro LED 25 are converged to the center compared with when the refraction structure 40G and the refraction structure 40B are not provided. Therefore, the refraction structure 40R, the refraction structure 40G, and the refraction structure 40B may increase the brightness of the micro LED 21, the micro LED 23, and the micro LED 25 in the normal direction, and reduce the possibility of light mixing of the lights emitted by the micro LED 21, the micro LED 23, and micro LED 25, thereby improving the display quality of the micro LED display device 100.

Referring to FIG. 1, in some embodiments, the micro LED display device 100 includes a cover layer 60 disposed on the refraction structure 40R, the refraction structure 40G, and the refraction structure 40B. The cover layer 60 may include glass, epoxy resin, silicone resin, polyurethane, any other applicable material, or a combination thereof, and the distance between the cover layer 60 and the substrate 10 may be within a range of about 10 μm to about 30 μm, but the present disclosure is not limited thereto. For example, the cover layer 60 may be a flat glass layer for protecting the refraction structure 40R, the refraction structure 40G, and the refraction structure 40B.

In particular, firstly, the micro LED 21, the micro LED 23, and the micro LED 25 may be respectively formed on the substrate 10, the refraction structure 40R, the refraction structure 40G, and the refraction structure 40B may be respectively formed on the cover layer 60, and then the cover layer 60 may be flip-mounted on the substrate 10 and coated with the interlayer 50 (e.g., transparent glue), so that the refraction structure 40R, the refraction structure 40G, and the refraction structure 40B respectively correspond to the micro LED 21, the micro LED 23, and the micro LED 25, and the interlayer 50 occupies the space between the micro LED 21 and the refraction structure 40R, the space between the micro LED 23 and the refraction structure 40G, and the space between the micro LED 25 and the refraction structure 40B, but the present disclosure is not limited thereto.

As shown in FIG. 1, in some embodiments, the micro LED display device 100 includes a light-shielding layer 70 disposed on the micro LED 21, the micro LED 23, and the micro LED 25 and surrounding the refraction structure 40R, the refraction structure 40G, and the refraction structure 40B. In particular, the light-shielding layer 70 may be disposed between the refraction structure 40R and the refraction structure 40G, or between the refraction structure 40G and the refraction structure 40B.

The material of the light-shielding layer 70 may include photoresist (e.g., black photoresist, or other applicable photoresist which is not transparent), ink (e.g., black ink, or any other applicable ink which is not transparent), molding compound (e.g., black molding compound, or any other applicable molding compound which is not transparent), solder mask (e.g., black solder mask, or any other applicable solder mask which is not transparent), epoxy polymer, any other applicable material, or a combination thereof. In addition, the material of the light-shielding layer 70 may include a light curing material, a thermal curing material, or a combination thereof, but the present disclosure is not limited thereto.

Similarly, the light-shielding layer 70 may be formed on the cover layer 60. For example, the light-shielding layer 70 may be formed on the cover layer 60 by physical vapor deposition (PVD), chemical vapor deposition (CVD), atomic layer deposition (ALD), evaporation, sputtering, the like, or a combination thereof, but the present disclosure is not limited thereto.

In some embodiments, the light-shielding layer 70 is as thick or thicker than the refraction structure 40R, the refraction structure 40G, and the refraction structure 40B. The light-shielding layer 70 may be used to reduce crosstalk between the light emitted by the micro LED 21, the light emitted by the micro LED 23, and the light emitted by the micro LED 25.

Figure 2:
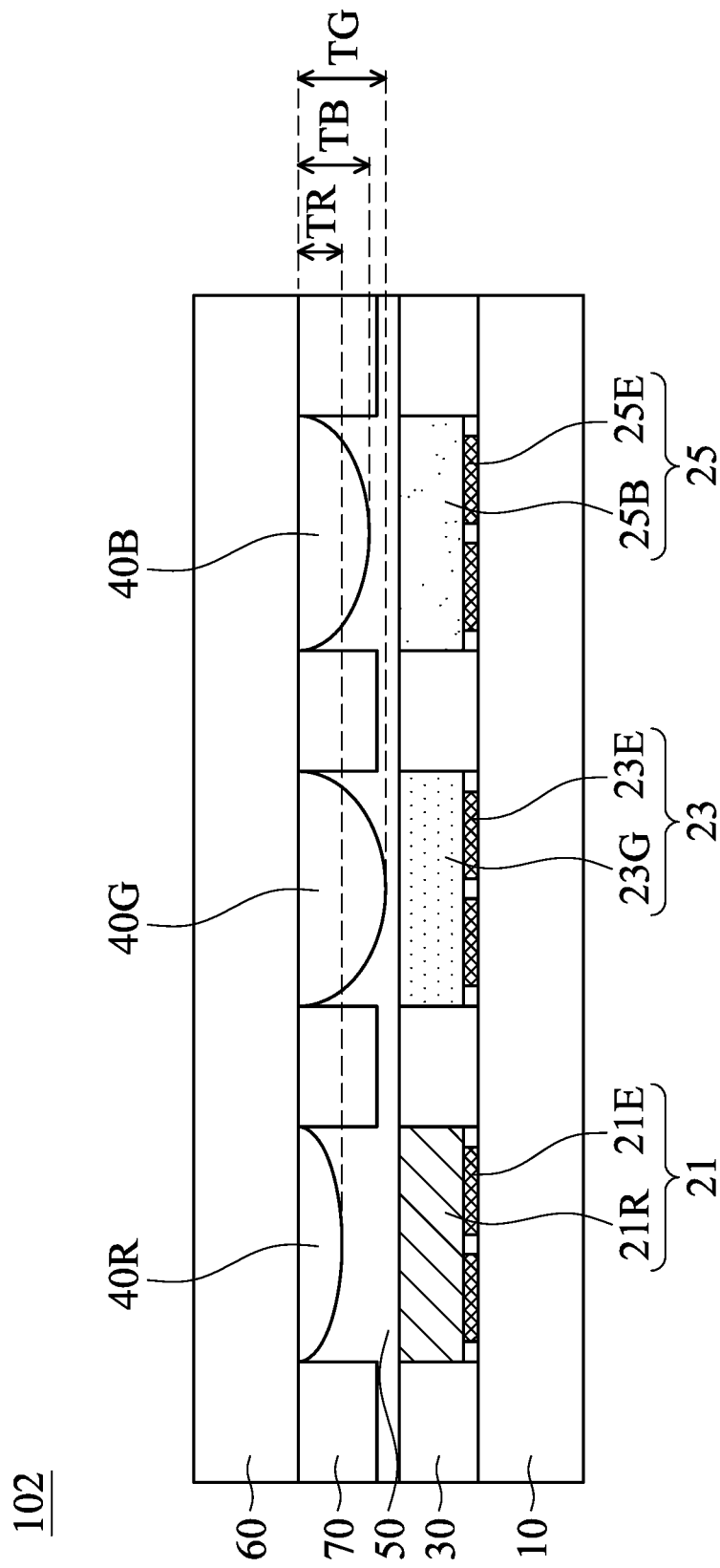
FIG. 2 is a partial cross-sectional view illustrating the micro LED display device according to another embodiment of the present disclosure.

FIG. 2 is a partial cross-sectional view illustrating the micro LED display device 102 according to another embodiment of the present disclosure. Similarly, some components of the micro LED display device 102 have been omitted in FIG. 2 for the sake of brevity.

The micro LED display device 102 shown in FIG. 2 has a similar structure to that of the micro LED display device 100 shown in FIG. 1. That is, the micro LED display device 102 includes a substrate 10. The micro LED display device 102 also includes a micro LED 21, a micro LED 23 and a micro LED 25 disposed on the substrate 10. The micro LED display device 102 further includes a refraction structure 40R, a refraction structure 40G, and a refraction structure 40B respectively disposed on and corresponding to the micro LED 21, the micro LED 23, and the micro LED 25. Moreover, the micro LED display device 102 includes an interlayer 50 disposed between the micro LED 21 and the refraction structure 40R, and the interlayer 50 is also disposed between the micro LED 23 and the refraction structure 40G and between the micro LED 25 and the refraction structure 40B. The micro LED display device 102 also includes a cover layer 60 disposed on the refraction structure 40R, the refraction structure 40G, and the refraction structure 40B.

Referring to FIG. 2, in some embodiments, the thickness TR of the refraction structure 40R, the thickness TG of the refraction structure 40G, and the thickness TB of the refraction structure 40B are different. That is, the focal lengths of the refraction structure 40R, the refraction structure 40G, and the refraction structure 40B are different. For example, as shown in FIG. 2, the thickness TG of the refraction structure 40G may be thicker than the thickness TB of the refraction structure 40B, and the thickness TB of the refraction structure 40B may be thicker than the thickness TR of the refraction structure 40R, but the present disclosure is not limited thereto.

Since the red light LED has lower light-emitting efficiency, and human eyes are more sensitive to green light, when the micro LED 21 is a red micro LED and the micro LED 23 is a green micro LED, the thickness TG of the refraction structure 40G that corresponds to the micro LED 23 (which emits green light) is designed to be thicker than the thickness TR of the refraction structure 40R that corresponds to the micro LED 21 (which emits red light), which may strengthen the convergence effect of green light. Therefore, in the embodiment shown in FIG. 2, the focal lengths of the refraction structure 40R, the refraction structure 40G, and the refraction structure 40B are designed to be different, so that it will make the light patterns of the three-color lights tend to be consistent and avoid mutual interference (e.g., avoid the green light covering the red light).

Figure 3:
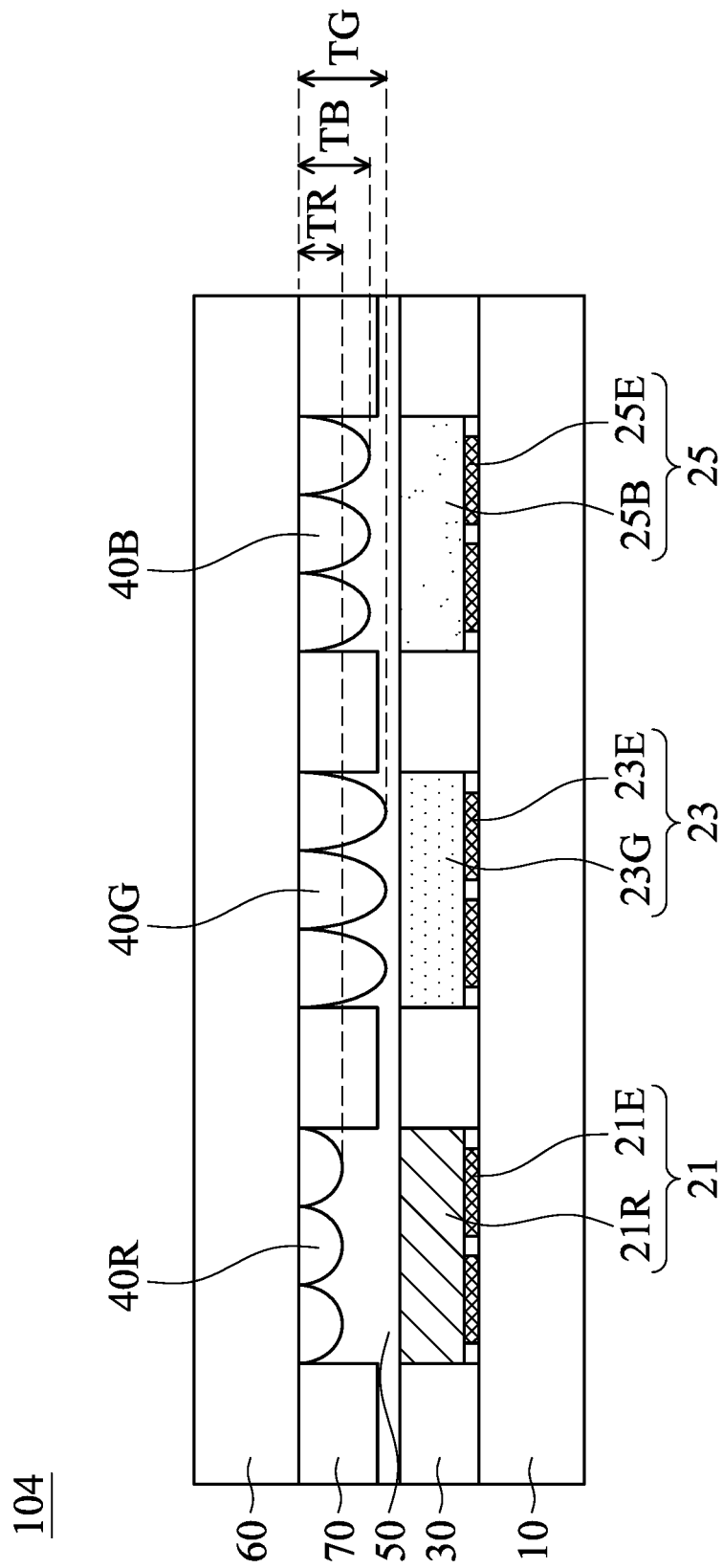
FIG. 3 is a partial cross-sectional view illustrating the micro LED display device according to another embodiment of the present disclosure.

FIG. 3 is a partial cross-sectional view illustrating the micro LED display device 104 according to another embodiment of the present disclosure. Similarly, some components of the micro LED display device 104 have been omitted in FIG. 3 for the sake of brevity.

Referring to FIG. 3, in some embodiments, the micro LED display device 104 includes a plurality of refraction structures 40R disposed on and corresponding to the micro LED 21. In some embodiments, the micro LED display device 104 also includes a plurality of refraction structures 40G disposed on and corresponding to the micro LED 23 and a plurality of refraction structures 40B disposed on and corresponding to the micro LED 25.

For example, the refraction structures 40R may form an M×N array, wherein M and N are positive integers greater than or equal to 1, respectively. Moreover, the refraction structures 40G or the refraction structures 40B may also respectively form M×N arrays. It should be noted that the number of refraction structures 40R, the number of refraction structures 40G, and the number of refraction structures 40B may be different from one another, and these numbers may be adjusted to meet practical needs.

In some embodiments, the refraction structures 40R have the same thickness TR, the refraction structures 40G have the same thickness TG, and the refraction structures 40B have the same thickness TB. Similarly, as shown in FIG. 3, the thickness TG of each refraction structure 40G may be thicker than the thickness TB of each refraction structure 40B, and the thickness TB of each refraction structure 40B may be thicker than the thickness TR of each refraction structure 40R, but the present disclosure is not limited thereto.

Figure 4:
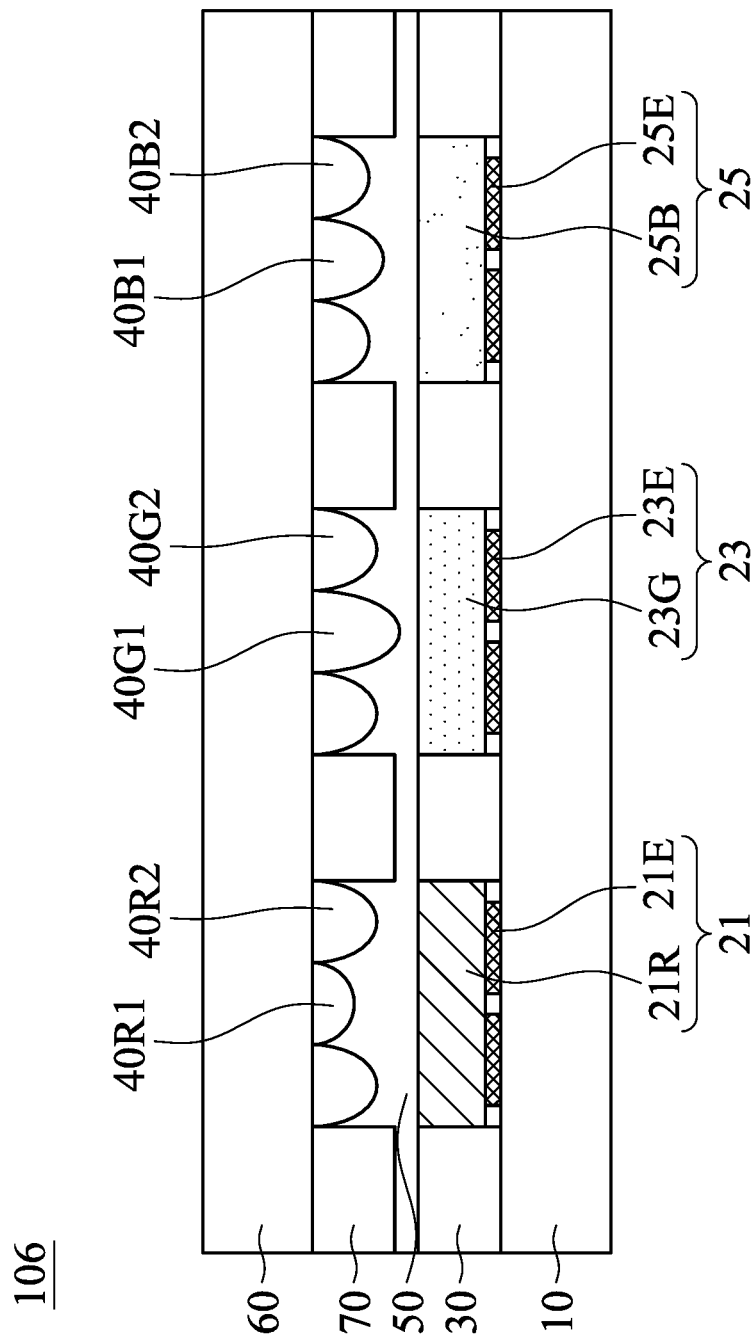
FIG. 4 is a partial cross-sectional view illustrating the micro LED display device according to another embodiment of the present disclosure.

FIG. 4 is a partial cross-sectional view illustrating the micro LED display device 106 according to another embodiment of the present disclosure. Similarly, some components of the micro LED display device 106 have been omitted in FIG. 4 for the sake of brevity.

In the embodiment shown in FIG. 4, the micro LED display device 106 also includes a plurality of refraction structures 40R1, 40R2 disposed on and corresponding to the micro LED 21, a plurality of refraction structures 40G1, 40G2 disposed on and corresponding to the micro LED 23, and a plurality of refraction structures 40B1 and 40B2 disposed on and corresponding to the micro LED 25. In some embodiments, the refraction structure 40R1 and the refraction structure 40R2 of the micro LED display device 106 have different thicknesses, the refraction structure 40G1 and the refraction structure 40G2 of the micro LED display device 106 have different thicknesses, and the refraction structure 40B1 and the refraction structure 40B2 of the micro LED display device 106 have different thicknesses.

For example, as shown in FIG. 4, the refraction structures 40R2 are disposed on two sides of the refraction structure 40R1, and the thickness of the refraction structure 40R2 is thicker than the thickness of the refraction structures 40R1; the refraction structures 40G2 are disposed on two sides of the refraction structure 40G1, and the thickness of the refraction structure 40G2 is thinner than the thickness of the refraction structures 40G1; the refraction structures 40B2 are disposed on two sides of the refraction structure 40B1, and the thickness of the refraction structure 40B2 is thinner than the thickness of the refraction structures 40B1.

When the micro LED 21 is a red micro LED, the micro LED 23 is a green micro LED, and the micro LED 25 is a blue micro LED, each refraction structure constitutes a concave lens or a convex lens with different curvatures, and the structure design of the micro LED display device 106 may be adjusted according to different needs. In FIG. 4, the aforementioned thickness design will make the red light more divergent, while the green light and blue light are relatively more convergent, so as to control the light patterns of the three colors to be consistent and avoid mutual interference, but the present disclosure is not limited thereto.

Figure 5A:
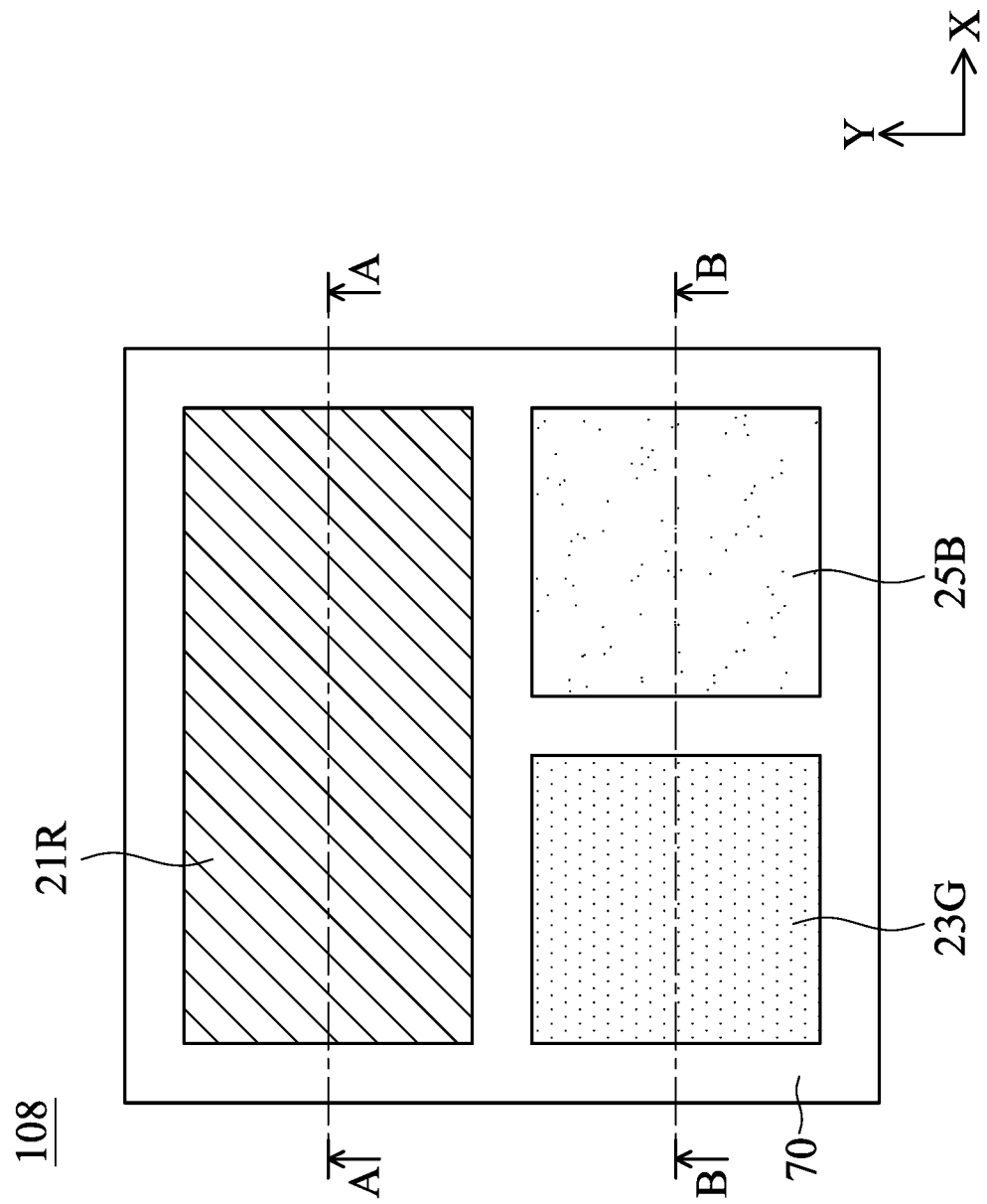
FIG. 5A is a partial top view illustrating the micro LED display device according to one embodiment of the present disclosure.
Figure 5B:
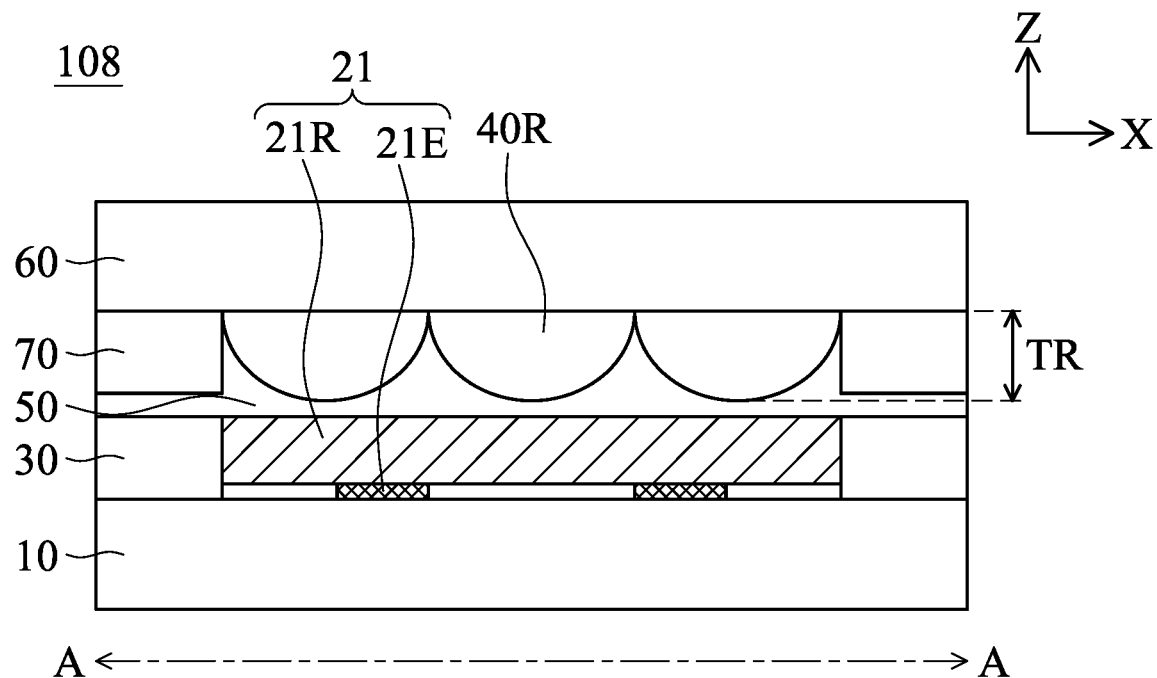
FIG. 5B is a partial cross-sectional illustrating the micro LED display device along line A-A in FIG. 5A.
Figure 5C:
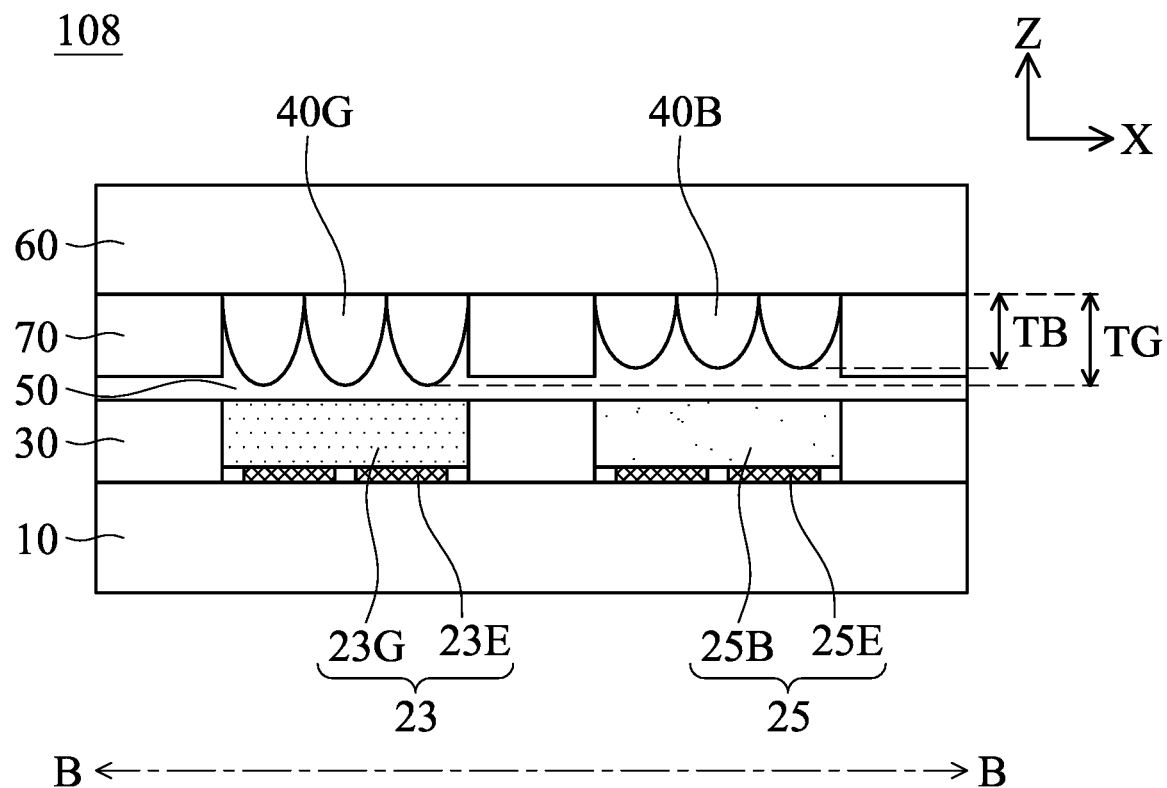
FIG. 5C is a partial cross-sectional view illustrating the micro LED display device 108 along line B-B in FIG. 5A.

FIG. 5A is a partial top view illustrating the micro LED display device 108 according to one embodiment of the present disclosure, FIG. 5B is a partial cross-sectional illustrating the micro LED display device 108 along line A-A in FIG. 5A, and FIG. 5C is a partial cross-sectional view illustrating the micro LED display device 108 along line B-B in FIG. 5A. Similarly, some components of the micro LED display device 108 have been omitted in FIG. 5A, FIG. 5B, and FIG. 5C for the sake of brevity.

Referring to FIG. 5A, in some embodiments, the micro LED 21 (only the red chip 21R is shown in FIG. 5A), the micro LED 23 (only the green chip 23G is shown in FIG. 5A), and the micro LED 25 (only the blue chip 25B is shown in FIG. 5A) form an array structure (e.g., 1×2 array). In some embodiments, the micro LED 21 (the red chip 21) is adjacent to the micro LED 23 (the green chip 23G) and the micro LED 25 (the blue chip 25B) along Y-direction, and the micro LED 23 (the green chip 23G) is adjacent to the micro LED 25 (the blue chip 25B) along X-direction.

As shown in FIG. 5A, in some embodiments, the area of the light-emitting surface of the micro LED 21 (i.e., the top surface of the red chip 21R) is larger than the area of the light-emitting surface of the micro LED 23 (i.e., the top surface of the green chip 23G) and the area of the light-emitting surface of the micro LED 25 (i.e., the top surface of the blue chip 25B). Moreover, as shown in FIG. 5B and FIG. 5C, in some embodiments, the radius of curvature of the refraction structure 40R is larger than the radius of curvature of the refraction structure 40G or the radius of curvature of the refraction structure 40B.

When the micro LED 21 is a red micro LED, the micro LED 23 is a green micro LED, and the micro LED 25 is a blue micro LED, the area of the light-emitting surface of the micro LED 21 (i.e., the top surface of the red chip 21R) is designed to be larger, and the radius of curvature of the refraction structure 40R is designed to be larger, which may make the visual experience of the red light and the green light (or blue light) more similar to the viewer.

As shown in FIG. 5B and FIG. 5C, the thickness TR of the refraction structure 40R and the thickness TG of the refraction structure 40G may be the same or similar, and the thickness TR of the refraction structure 40R and the thickness TG of the refraction structure 40G are both thicker than the thickness TB of the refraction structure 40B, but the present disclosure is not limited thereto. It should be noted that although the number of refraction structures 40R, the number of refraction structures 40G, and the number of refraction structures 40B are the same in FIG. 5B and FIG. 5C, the present disclosure is not limited thereto. In some other embodiments, the number of refraction structures 40R, the number of refraction structures 40G, and the number of refraction structures 40B may be different.

Figure 6A:
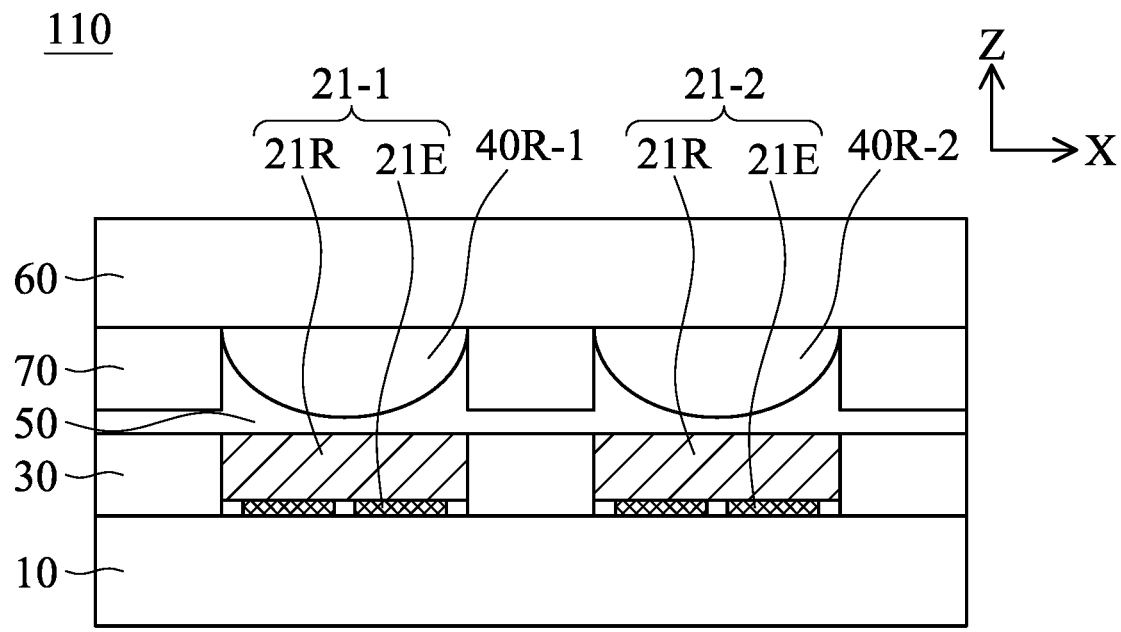
FIG. 6A and FIG. 6B are partial cross-sectional views respectively illustrating the micro LED display device along different lines according to another embodiment of the present disclosure.
Figure 6B:
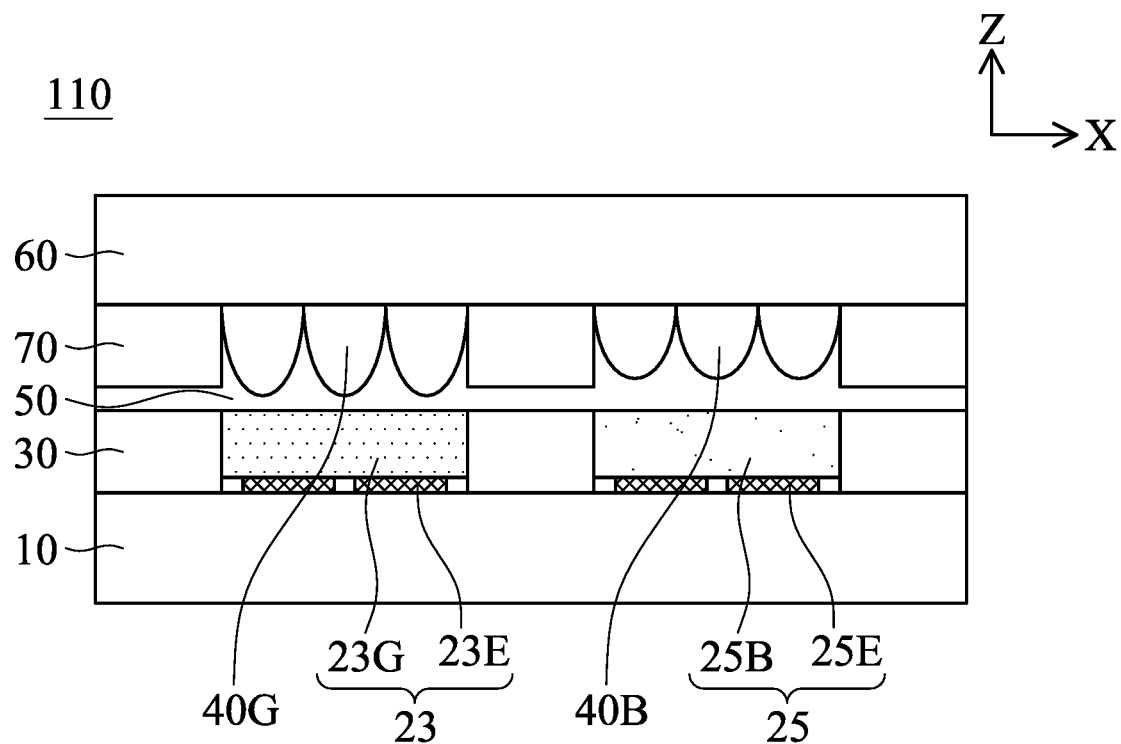

FIG. 6A and FIG. 6B are partial cross-sectional views respectively illustrating the micro LED display device 110 along different lines according to another embodiment of the present disclosure. Similarly, some components of the micro LED display device 110 have been omitted in FIG. 6A, and FIG. 6B for the sake of brevity.

Referring to FIG. 6A, in some embodiments, the micro LED display device 110 includes an auxiliary micro LED 21-2 disposed on the substrate 10 and adjacent to the micro LED 21-1 along X-direction. Moreover, in some embodiments, the micro LED display device 110 also includes an auxiliary refraction structure 40R-2 disposed on and corresponding to the auxiliary micro LED 21-2 and having a structure similar to the refraction structure 40R-1, which will not be repeated here.

In addition, the top view of the micro LED display device 110 may be similar to the partial top view of the micro LED display device 108 shown in FIG. 5A. That is, the micro LED 21-1, the auxiliary micro LED 21-2, the micro LED 23, and the micro LED 25 of the micro LED display device 110 may form an array structure (e.g., 2×2 array). For example, the micro LED 21-1 may be adjacent to the micro LED 23 along Y-direction, the auxiliary micro LED 21-2 may be adjacent to the micro LED 25 along Y-direction, and the micro LED 23 (the green chip 23G) may be adjacent to the micro LED 25 (the blue chip 25B) along X-direction, but the present disclosure is not limited thereto.

The auxiliary micro LED 21-2 may be used as auxiliary light or to repair when the micro LED 21-1 fails. The number of refraction structures 40R-1 and the number of auxiliary refraction structures 40R-2 may be the same or different, and this may be determined by practical needs. The number of refraction structures 40R-1 (or the number of auxiliary refraction structures 40R-2) may be different than the number of refraction structures 40G or the number of refraction structures 40B. For example, as shown in FIG. 6A and FIG. 6B, one refraction structure 40R-1 is disposed on and corresponds to the micro LED 21-1, one auxiliary refraction structure 40R-2 is disposed on and corresponds to the auxiliary micro LED 21-2, the refraction structures 40G are disposed on and correspond to the micro LED 23, and the refraction structures 40B are disposed on and correspond to the micro LED 25, but the present disclosure is not limited thereto. In addition, the thickness of the refraction structure 40R-1, the thickness of the auxiliary refraction structure 40R-2, the thickness of the refraction structure 40G, and the thickness of the refraction structure 40B may be different, which will not be repeated again here.

Figure 7A:
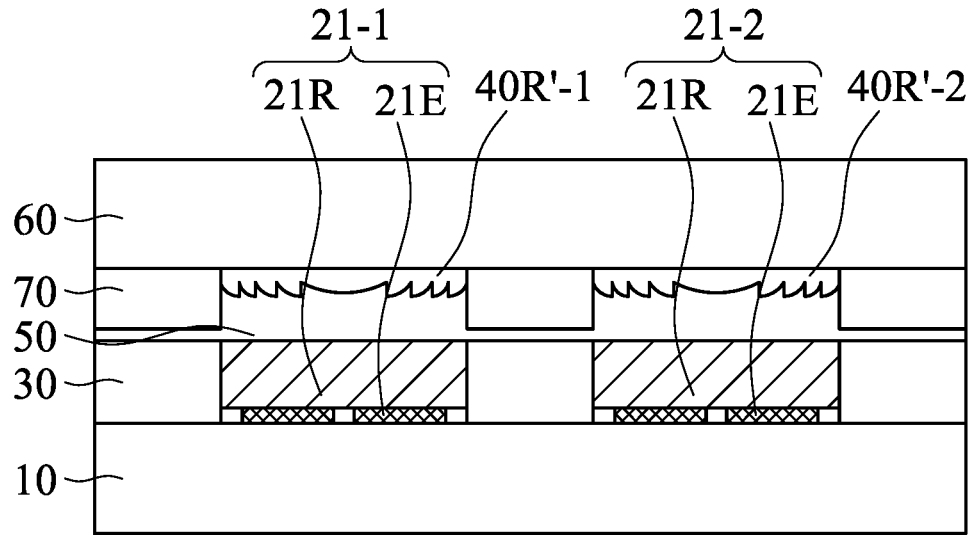
FIG. 7A and FIG. 7B are partial cross-sectional views respectively illustrating the micro LED display device along different lines according to another embodiment of the present disclosure.
Figure 7B:
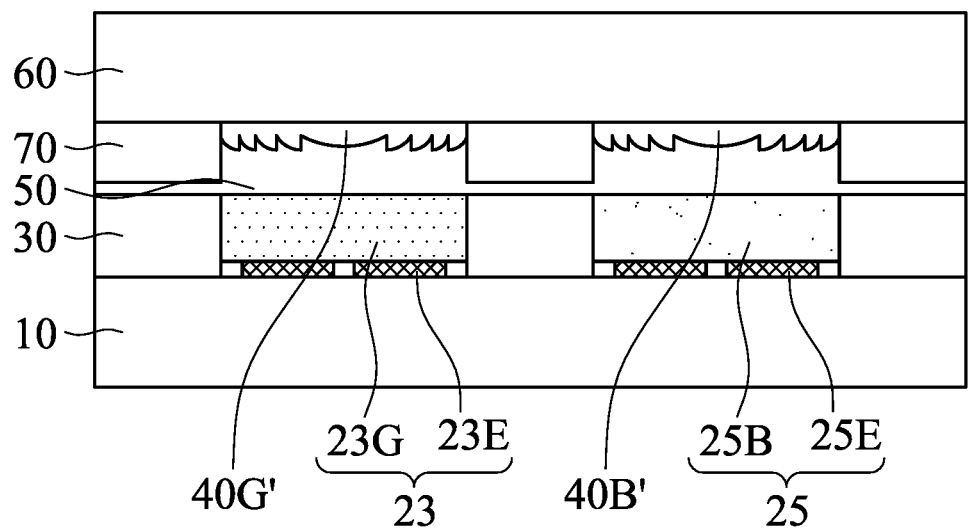

FIG. 7A and FIG. 7B are partial cross-sectional views respectively illustrating the micro LED display device 112 along different lines according to another embodiment of the present disclosure. Similarly, the top view of the micro LED display device 112 may be similar to the partial top view of the micro LED display device 108 shown in FIG. 5A. In addition, some components of the micro LED display device 112 have been omitted in FIG. 7A, and FIG. 7B for the sake of brevity.

The micro LED display device 112 has a structure similar to the micro LED display device 110 shown in FIG. 6A and FIG. 6B. Referring to FIG. 7A and FIG. 7B, in some embodiments, the refraction structure 40R'-1, the auxiliary refraction structure 40R'-2, the refraction structure 40G', and the refraction structure 40B' are each a Fresnel lens. The Fresnel lens has the advantages of smaller volume, shorter focal length under the same thickness, better focusing ability, and so on, which may improve the display quality of the micro LED display device 112 and further reduce the size of the micro LED display device 112.

As shown in FIG. 7A and FIG. 7B, the light-shielding layer 70 is as thick or thicker than the refraction structure 40R'-1, the auxiliary refraction structure 40R'-2, the refraction structure 40G', and the refraction structure 40B', so the light emitted by the micro LED display device 112 is focused through the corresponding refraction structure to ensure the light pattern of each color light.

Figure 8:
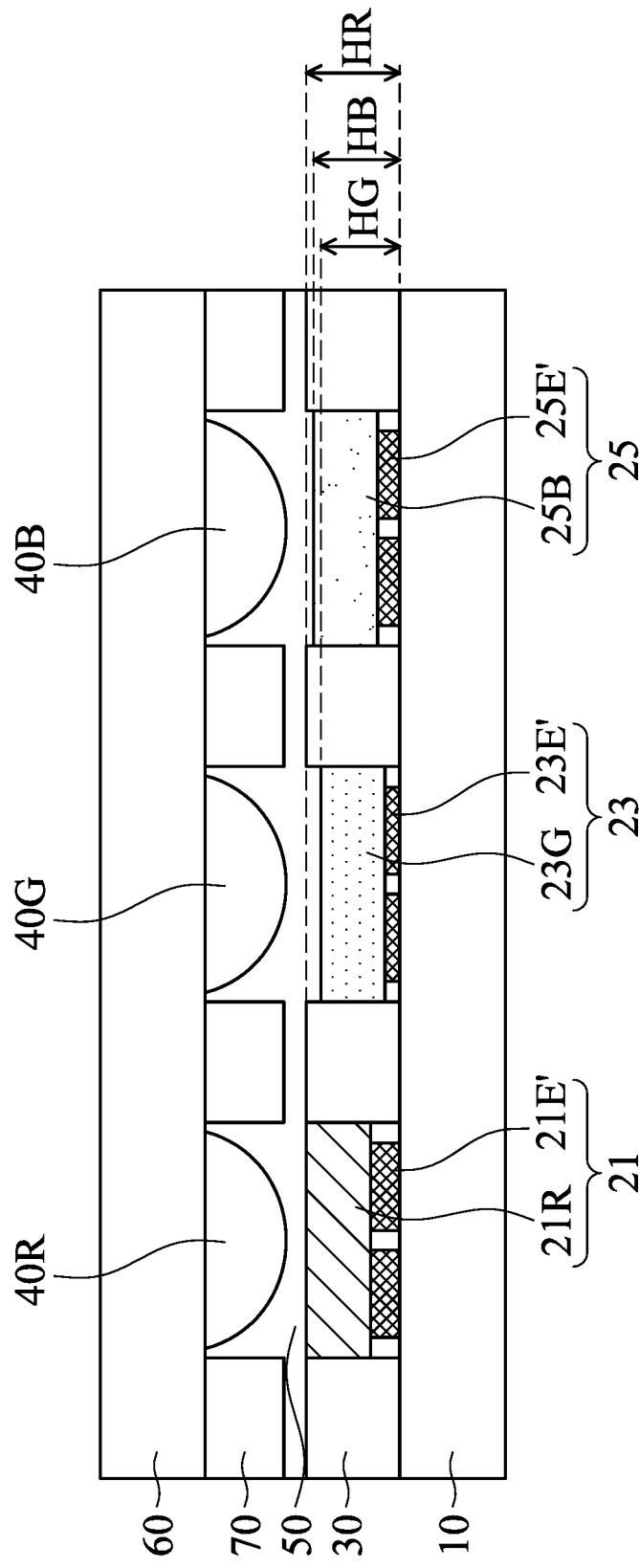
FIG. 8 is a partial cross-sectional view illustrating the micro LED display device according to another embodiment of the present disclosure.

FIG. 8 is a partial cross-sectional view illustrating the micro LED display device 114 according to another embodiment of the present disclosure. Similarly, some components of the micro LED display device 114 have been omitted in FIG. 8 for the sake of brevity.

Referring to FIG. 8, in some embodiments, the height of the light-emitting surface of the micro LED 21 relative to the substrate 10, the height of the light-emitting surface of the micro LED 23 relative to the substrate 10, and the height of the light-emitting surface of the micro LED 25 relative to the substrate 10 are different. For example, the thickness of the electrode 21E' of the micro LED 21, the thickness of the electrode 23E' of the micro LED 23, and the thickness of the electrode 25E' of the micro LED 25 may be changed, or the thickness of the solder (not shown) connected to the electrode 21E', the electrode 23E' and the electrode 25E' on the substrate 10 may be changed, so that the light-emitting surface of each color light chip has different heights.

As shown in FIG. 8, the height of the light-emitting surface of the micro LED 21 relative to the substrate 10 may be higher than the height of the light-emitting surface of the micro LED 25 relative to the substrate 10, and the height of the light-emitting surface of the micro LED 25 relative to the substrate 10 may be higher than the height of the light-emitting surface of the micro LED 23 relative to the substrate 10, but the present disclosure is not limited thereto. In other words, the shortest distance HR between the light-emitting surface of the micro LED 21 and the substrate 10 may be longer than the shortest distance HB between the light-emitting surface of the micro LED 25 and the substrate 10, and the shortest distance HB between the light-emitting surface of the micro LED 25 and the substrate 10 may be longer than the shortest distance HG between the light-emitting surface of the micro LED 23 and the substrate 10.

Figure 9:
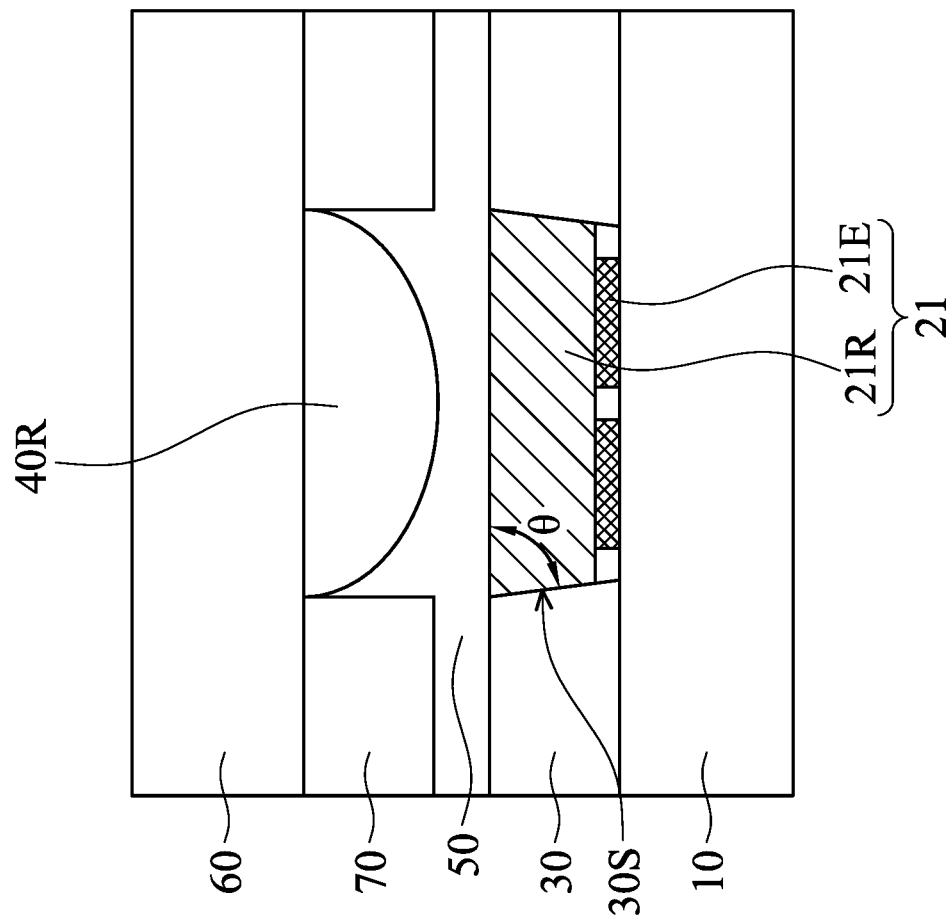
FIG. 9 is a partial cross-sectional view illustrating the micro LED display device according to another embodiment of the present disclosure.

FIG. 9 is a partial cross-sectional view illustrating the micro LED display device 116 according to another embodiment of the present disclosure. Similarly, some components of the micro LED display device 116 have been omitted in FIG. 9 for the sake of brevity. For example, FIG. 9 only shows the micro LED 21 and the refraction structure 40R that is disposed on and corresponds to the micro LED 21, but the micro LED 23 and the refraction structure 40G that is disposed on and corresponds to the micro LED 23, and the micro LED 25 and the refraction structure 40B that is disposed on and corresponds to the micro LED 25 may have similar structure.

Referring to FIG. 9, in some embodiments, the reflective layer 30 has a reflective surface 30S in direct contact with the side surface of the micro LED 21, and there is an inclined angle θ between the reflective surface 30S and the light-emitting surface of the micro LED 21. For example, the inclined angle θ may be within a range of about 60° to about 90°, but the present disclosure is not limited thereto.

In some embodiments, the orthographic projection of the refraction structure 40R on the substrate 10 completely covers the orthographic projection of the reflective surface 30S on the substrate 10. Due to the small volume of the micro LED 21, the ratio of the light emitted from the side may be higher than the ratio of the light emitted from the forward direction, and the inclined angle θ between the reflective surface 30S and the light-emitting surface of the micro LED 21 is helpful to greatly increase the ratio of light emitted from the forward direction.

Figure 10:
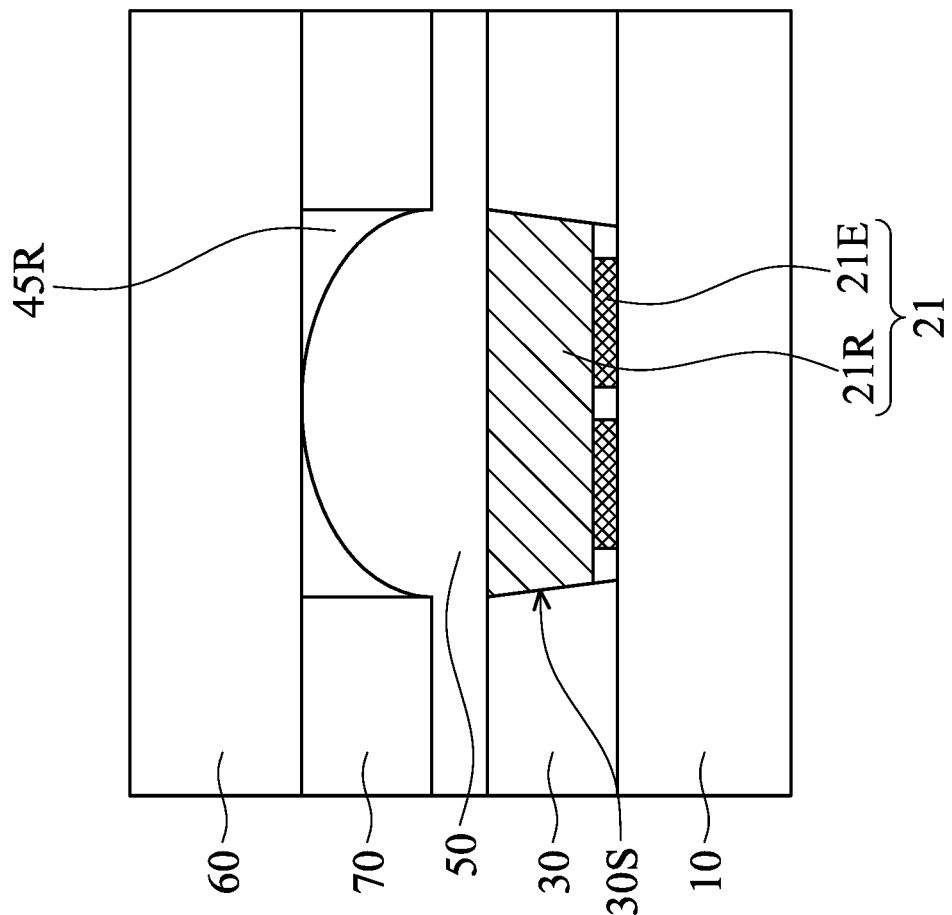
FIG. 10 is a partial cross-sectional view illustrating the micro LED display device according to another embodiment of the present disclosure.

FIG. 10 is a partial cross-sectional view illustrating the micro LED display device 118 according to another embodiment of the present disclosure. Similarly, some components of the micro LED display device 118 have been omitted in FIG. 10 for the sake of brevity.

Referring to FIG. 10, in some embodiments, the refractive index of the interlayer 50 is greater than the refractive index of the refraction structure 45R that is disposed on and corresponds to the micro LED 21, and the refraction structure 45R includes a micro concave lens. Similarly, the refraction structure (not shown) that is disposed on and corresponds to the micro LED 23 or the refraction structure (not shown) that is disposed on and corresponds to the micro LED 25 each may also include a micro concave lens, which will not be repeated here again.

In summary, in the micro LED display device according to the embodiments of the present disclosure, at least one refraction structure is disposed on and corresponds to each micro LED. The refraction structure may change the light-emitting direction of the micro LED, thereby increasing the overall brightness of the micro LED display device in the forward direction (i.e., the normal direction of the light-emitting surface of the micro LED). Moreover, the refraction structure may effectively reduce light mixing, thereby improving the display quality of the micro LED display device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro LED display device, comprising:
   a substrate;
   a first micro LED disposed on the substrate;
   at least one first refraction structure disposed on and corresponding to the first micro LED;
   a second micro LED disposed on the substrate and adjacent to the first micro LED;
   at least one second refraction structure disposed on and corresponding to the second micro LED;
   a first auxiliary micro LED disposed on the substrate and adjacent to the first micro LED; and
   at least one first auxiliary refraction structure disposed on and corresponding to the first auxiliary micro LED.

2. The micro LED display device according to claim 1, wherein a first optical axis of the first refraction structure passes through a center of a light-emitting surface of the first micro LED, and a second optical axis of the second refraction structure passes through a center of a light-emitting surface of the second micro LED.

3. The micro LED display device according to claim 1, wherein a thickness of the second refraction structure is different from a thickness of the first refraction structure.

4. The micro LED display device according to claim 1, further comprising:

a plurality of first refraction structures disposed on and corresponding to the first micro LED; and a plurality of second refraction structures disposed on and corresponding to the second micro LED.

5. The micro LED display device according to claim 4, wherein the first refraction structures have a first thickness, the second refraction structures have a second thickness, and the second thickness is different from the first thickness.

6. The micro LED display device according to claim 4, wherein the first refraction structures have different thicknesses, or the second refraction structures have different thicknesses.

7. The micro LED display device according to claim 1, further comprising:

a third micro LED disposed on the substrate and adjacent to the second micro LED; and at least one third refraction structure disposed on and corresponding to the third micro LED.

8. The micro LED display device according to claim 7, wherein the second micro LED is adjacent to the first micro LED along a first direction, the third micro LED is adjacent to the second micro LED along a second direction, and the second direction is perpendicular to the first direction.

9. The micro LED display device according to claim 8, wherein the first micro LED is a red micro LED.

10. The micro LED display device according to claim 9, wherein an area of a light-emitting surface of the first micro LED is larger than an area of a light-emitting surface of the second micro LED and larger than an area of a light-emitting surface of the third micro LED.

11. The micro LED display device according to claim 9, wherein a radius of curvature of the first refraction structure is larger than a radius of curvature of the second refraction structure or a radius of curvature of the third refraction structure.

12. The micro LED display device according to claim 10, wherein a thickness of the first refraction structure and a thickness of the second refraction structure are the same.

13. The micro LED display device according to claim 1, wherein a number of the first refraction structure is less than a number of the second refraction structure.

14. The micro LED display device according to claim 1, further comprising:

a reflective layer disposed on the substrate and surrounding the first micro LED, wherein the reflective layer has a reflective surface in direct contact with a side surface of the first micro LED, and there is an inclined angle between the reflective surface and a light-emitting surface of the first micro LED.

15. The micro LED display device according to claim 14, wherein an orthographic projection of the first refraction structure on the substrate completely covers an orthographic projection of the reflective surface on the substrate.

16. The micro LED display device according to claim 1, further comprising:

an interlayer disposed between the first micro LED and the first refraction structure, wherein a refractive index of the interlayer is different from a refractive index of the first refraction structure.

17. The micro LED display device according to claim 16, wherein the refractive index of the interlayer is smaller than the refractive index of the first refraction structure, and the first refraction structure comprises a micro convex lens.

18. The micro LED display device according to claim 16, wherein the refractive index of the interlayer is greater than the refractive index of the first refraction structure, and the first refraction structure comprises a micro concave lens.

19. The micro LED display device according to claim 1, wherein the first refraction structure is a Fresnel lens.

\* \* \* \* \*